United States Patent
Takahashi

(10) Patent No.: US 8,470,641 B2
(45) Date of Patent: Jun. 25, 2013

(54) EXPOSED MOLD

(75) Inventor: Yoshimi Takahashi, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 770 days.

(21) Appl. No.: 12/640,827

(22) Filed: Dec. 17, 2009

(65) Prior Publication Data

US 2011/0151623 A1     Jun. 23, 2011

(51) Int. Cl.
*H01L 21/00*     (2006.01)

(52) U.S. Cl.
USPC .................................. 438/112; 257/E21.599

(58) Field of Classification Search
USPC ................. 438/106, 110, 112, 124, 125, 127; 257/E21.599
See application file for complete search history.

(56) References Cited

U.S. PATENT DOCUMENTS

| 5,987,739 | A  | * | 11/1999 | Lake ................................. 29/841 |
| 6,344,162 | B1 | * | 2/2002  | Miyajima ................. 264/272.14 |
| 6,872,593 | B2 | * | 3/2005  | Matsunami .................... 438/106 |
| 7,147,447 | B1 |   | 12/2006 | Takahashi |
| 7,189,601 | B2 |   | 3/2007  | Takahashi |
| 7,520,052 | B2 |   | 4/2009  | Takahashi et al. |
| 2009/0278238 | A1 | | 11/2009 | Bonifield et al. |
| 2009/0278245 | A1 | | 11/2009 | Bonifield et al. |
| 2009/0291524 | A1 | | 11/2009 | Takahashi |

* cited by examiner

*Primary Examiner* — William D Coleman
(74) *Attorney, Agent, or Firm* — Steven A. Shaw; W. James Brady; Frederick J. Telecky, Jr.

(57) ABSTRACT

A method for forming a semiconductor device can include providing a patterned layer of mold compound having a plurality of individual mold compound structures overlying a base film. The plurality of mold compound structures are aligned with a plurality of semiconductor dice to interpose the individual mold compound structures between the plurality of semiconductor dice. A pressure is applied to the individual mold compound structures to fill spaces between each of the plurality of semiconductor dice with the mold compound. The mold compound structures can be formed on the base film using a photosensitive mold compound. The mold compound structures can also be formed through the use of a patterned mask and a screen printing process.

12 Claims, 8 Drawing Sheets

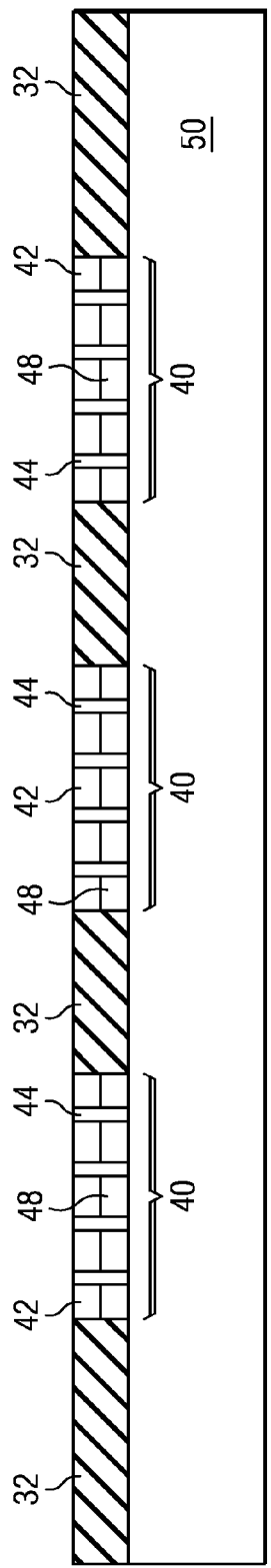
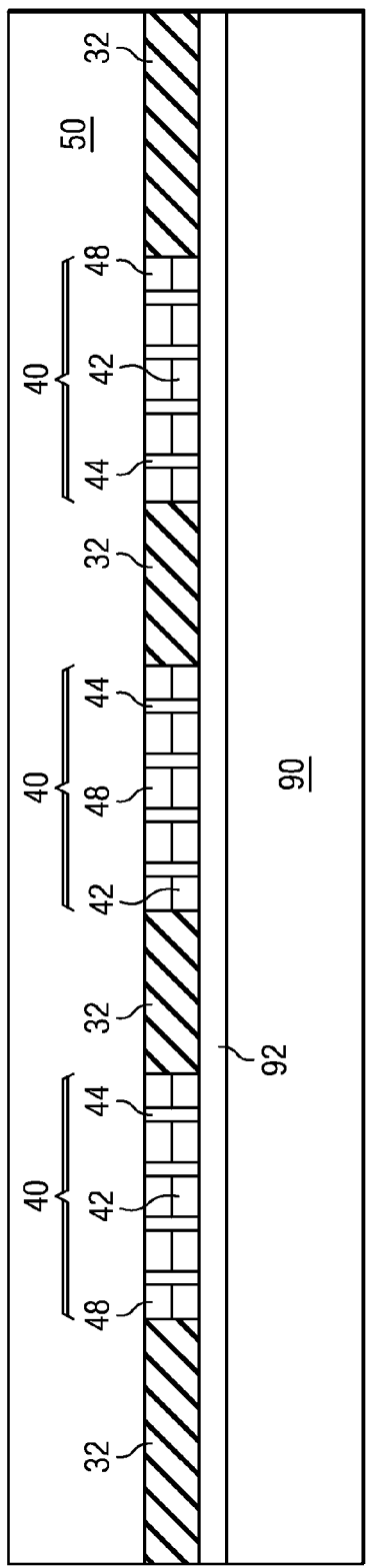

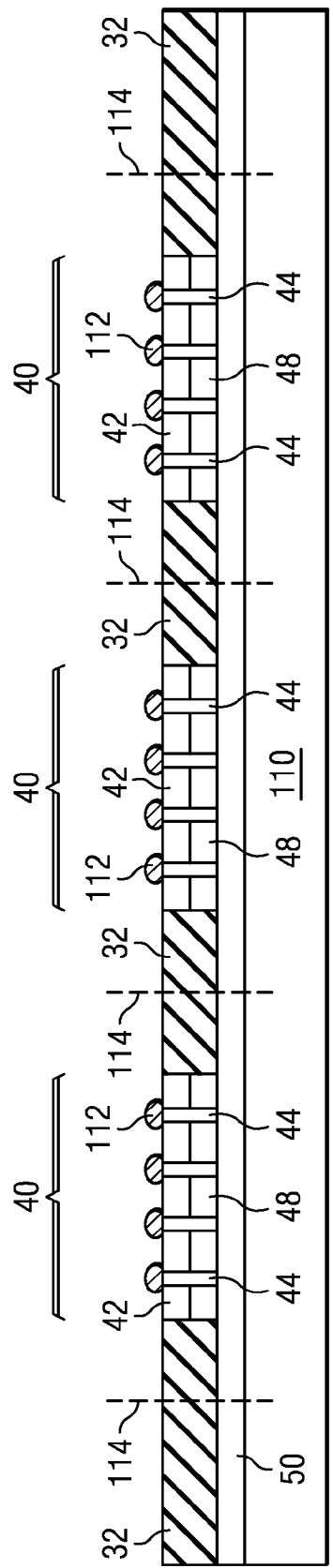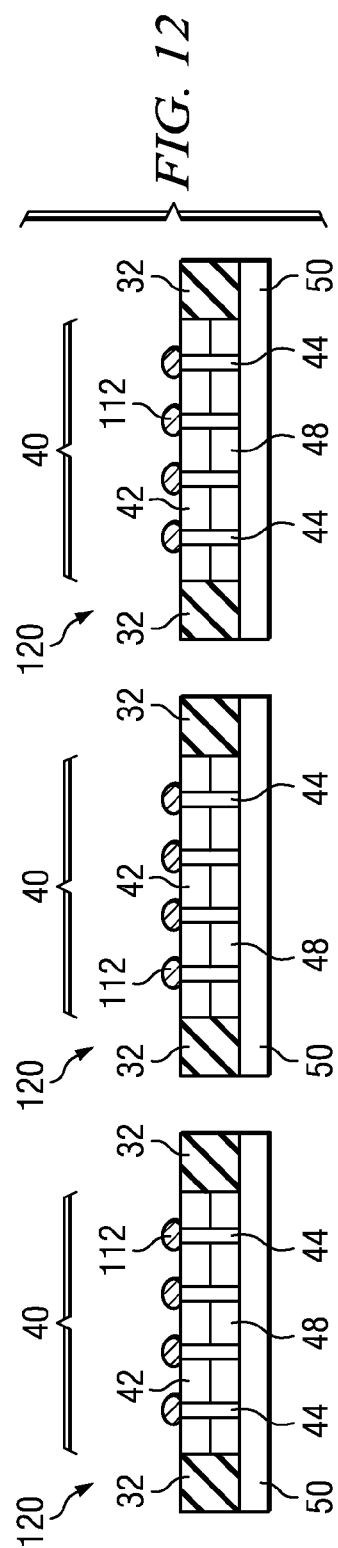

EXPOSED MOLD

CROSS-REFERENCE TO RELATED APPLICATION

This application claims priority to U.S. Provisional Application Ser. No. 61/139,401, filed Dec. 19, 2008, which is incorporated herein by reference.

FIELD OF THE INVENTION

This invention relates to the field of semiconductor device manufacture, and more particularly to a method for forming device encapsulation over a semiconductor device surface.

BACKGROUND OF THE INVENTION

Semiconductor devices typically include a semiconductor wafer section such as a semiconductor die having a circuit (i.e. front) side with circuitry thereon, and a noncircuit (i.e. back) side. To protect the semiconductor die, the die can be encapsulated in a plastic resin material or protected by a thin passivation layer.

A semiconductor device can further include one or more conductor-filled openings which extend from the circuit side to the noncircuit side of the semiconductor die, referred to as through-substrate vias (TSV's) or through-silicon vias. TSV's are vertical electrical connections that extend from one of the electrically conductive levels formed on the top surface of a wafer or IC die (e.g., contact level or one of the metal interconnect levels) to the backside (bottom) surface. As a result, a TSV device can be bonded face-up and utilize vertical electrical paths to couple to other IC devices (e.g., on a die, wafer) or to mount to a receiving substrate. The vertical electrical paths are significantly shortened relative to conventional wire bonding technology, generally leading to significantly faster device operation.

To fabricate a TSV wafer including a plurality of dice, openings can be formed within one or more dice on the wafer to a depth less than the full wafer thickness using chemical etching, laser drilling, or one of several energetic methods, such as reactive ion etching (RIE). Once the vias are formed, a dielectric liner can be formed in the opening to provide electrical isolation from the surrounding substrate, then the opening is filled with a conductor (e.g., copper, tungsten, or doped polysilicon) to form embedded TSV's. The bottom of the embedded TSV is generally referred to as an embedded TSV tip. Since most electrically conductive filler materials are metals that can degrade minority carrier lifetimes (e.g., copper or tungsten), a barrier layer is generally deposited on the dielectric liner. In the case of an electroplated metal (e.g., copper) process, a seed layer is generally added after the barrier layer.

A back grinding step can be used to thin the wafer by removing a sufficient thickness of the substrate from the bottom surface of the wafer to reach the embedded TSV tip to expose the electrically conductive filler material at the distal end of the TSV tip. The high substrate removal rate provided by the back grinding process is needed for manufacturability of the thinning process due to the large substrate thickness being removed. A subsequent polish step can be used to remove a thickness of material from the bottom surface of the substrate in an attempt to reduce the mechanical damage and contamination generated by the back grinding process. Alternatively or additionally, a wet or dry chemical etch can be used to reduce the mechanical damage and the contamination resulting from the back grinding.

In one process, the distal end of the completed TSV tip is flush with the bottom surface of the substrate. In another process, a silicon etch is performed such that the TSV's protrude from the back of the wafer, then a protective layer is formed over the back side of the TSV wafer prior to singulating (i.e. singularizing) the plurality of dice. The protective layer can include a nonconductive film (NCF) formed over the back of the wafer to a depth which exposes the distal end of the TSV.

After forming the TSV die, it can be mounted with the circuit side facing away from the receiving substrate in a "face-up" position. After attachment to the receiving substrate, electrical connections such as solder balls can be applied to the TSV's at the front side of the die, and another device can be connected to the TSV die with the solder balls.

Various processes can be performed to protect the electrical connection between the TSV die and the receiving substrate. In one process, conductive structures such as solder balls are applied to either the TSV's at the back side of the die or to landing pads on the receiving substrate, then a nonconductive paste (NCP) is applied to the receiving substrate. The TSV die is placed into the paste with the TSV's aligned with the landing pads, and the solder balls are connected on local reflow using a thermal compression bonding or mass reflow to effect electrical connection between the TSV die and receiving substrate. The nonconductive paste is then cured such that the solder connections are protected.

In another process, referred to as "capillary unclean" (CUF), the TSV die is electrically connected to landing pads of the receiving substrate, and a nonconductive liquid encapsulation is placed at one or more edges of the TSV die. Due to capillarity resulting from the close proximity of the TSV die to the receiving substrate, the liquid encapsulation is drawn between the TSV die and receiving substrate, where it is cured to provide protection.

Once attachment to the receiving substrate is made, TSV's can be used to transfer a signal from the circuit side of the TSV die to the back side, for example to provide back-side access to a ground node on the front of the die. TSV's can also be used to pass a signal through the die, for example from another device mounted to the front of the TSV die, to the receiving substrate.

In another process, the receiving substrate is a semiconductor wafer, which is diced after the attachment of a plurality of TSV dice to provide a plurality of semiconductor devices, each device including two wafer sections. Each of the plurality of semiconductor devices can be attached to a PCB or other receiving substrate.

SUMMARY OF THE EMBODIMENTS

The inventor has realized that manufacturing a semiconductor device protected by encapsulation or passivation while exposing the TSV at the front surface of the semiconductor die can cause problems. For example, encapsulation techniques that form the mold compound during or after attaching the TSV die to the receiving substrate can result in mold compound flowing onto the circuit side of the TSV die and onto the TSV's or other structures. By covering connection points with this undesired front-side mold compound, referred to herein as "mold flash," poor electrical connections or electrical opens can result. For example, if the TSV's are partially or completely covered with mold flash, attaching solder balls to the TSV's is not possible without reworking the device. Removal of mold flash without damaging the circuitry of the TSV die is difficult and expensive.

To provide a thin semiconductor device with exposed TSV surfaces, the inventor has developed a new method of semiconductor device formation. An embodiment of the present teachings can include the use of a photosensitive mold compound backed with a supporting base film. The layer of photosensitive mold compound is exposed to patterned radiation, for example using a photomask process. A portion of the mold layer is removed to provide mold structures having a measured volume, which are supported by the base film.

Each mold structure is interposed between a pair of semiconductor dice which are already mounted to a receiving substrate such as a semiconductor wafer. A press die is used under controlled pressure and heat to flow the mold structures and to fill a volume between the pair of semiconductor dice with the mold compound. The base film contacts the circuit side of the TSV's to prevent mold flash, which leaves a surface of each TSV exposed subsequent to curing the mold compound.

After forming the mold compound, the base film is removed to expose the semiconductor dice and TSV's, then the supporting substrate can be back ground to thin the die-supporting substrate assembly. The mold compound and supporting substrate can then severed to singulate each semiconductor device. Connection to a receiving substrate can be performed after forming the mold compound and singulating the plurality of dice.

Because of controlled pressure and mold compound volume, the mold compound is contained and does not flow over the surface of the TSV die. The process can reduce electrical opens, decrease rework and scrap, and result in reduced manufacturing costs.

BRIEF DESCRIPTION OF THE DRAWINGS

The accompanying drawings, which are incorporated in and constitute a part of this specification, illustrate embodiments of the invention and together with the description, serve to explain the principles of the invention. In the figures:

FIGS. 5-12 are cross sections depicting in-process structures which can be formed according to a method of the present teachings to form a semiconductor device;

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

Figure 1:
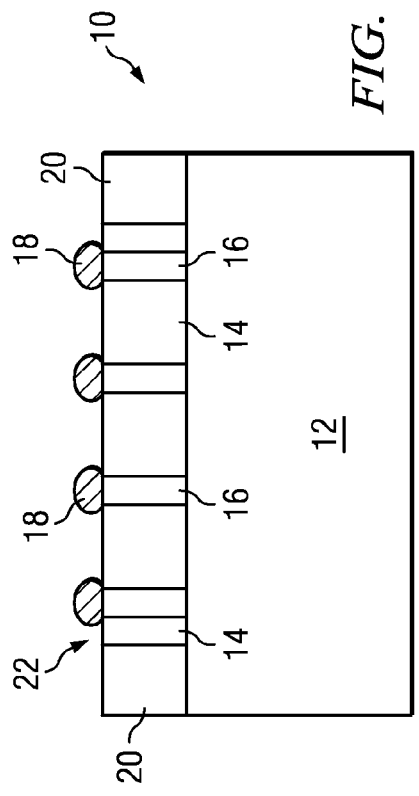
FIG. 1 is a cross section of a semiconductor device which can be formed according to the present teachings.

FIG. 1 depicts a semiconductor device assembly 10 including a receiving substrate 12 upon which a semiconductor die 14 is mounted. The receiving substrate 12 can be a printed circuit board (PCB), a semiconductor wafer or wafer section, or another semiconductor die. The die 14 includes one or more through-substrate vias (TSV's) 16 which can electrically connect circuitry (not individually depicted) on the front side (upper surface as depicted in FIG. 1) of the semiconductor die 14 with circuitry (not individually depicted) on the front side of the receiving substrate. After attaching the die 14 to the receiving substrate, solder bumps, balls, etc. 18 can be attached to the TSV's and/or circuitry of the semiconductor die 14 to allow electrical connection with another overlying device (not depicted) such as a PCB, wafer, wafer section, etc.

FIG. 1 further depicts mold compound 20 which is conventionally formed after electrically connecting the die 14 to the receiving substrate 12. In a conventional process, the mold compound can flow into a space (not depicted) between the die 14 and the receiving substrate 12 in a capillary underfill (CUF) process, or a nonconductive paste (NCP) can be applied to the receiving substrate 12 prior to attaching the die 14 to the receiving substrate. During these conventional processes, the protective material can flow across the circuitry on the front surface 22 of the die 14 to form mold flash and prevent electrical attachment of the circuitry on the front of the die 14 with the solder bumps 18.

Figure 2:
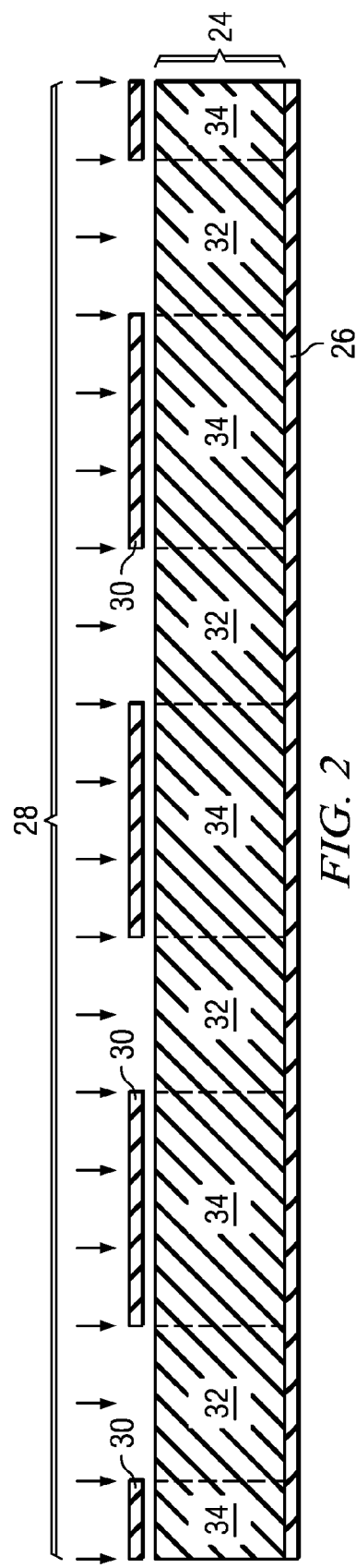
FIGS. 2 and 3 are cross sections depicting in-process mold compound structures having a controlled volume formed according to the present teachings.

A process according to the present teachings can be used to form a device such as the one depicted in FIG. 1 while reducing or eliminating the occurrence of mold flash. As depicted in FIG. 2, an embodiment of the process can include the use of a photosensitive mold compound (hereinafter, "PMC") 24 supported by a base film 26. The PMC 24 can include polyimide, epoxy, and other polymers, while the base film can include a material such as polyethylene terephthalate (PET), ethylene/tetrafluoroethylene copolymer (ETFE), polytetrafluoroethylene (PTFE), acrylic base film, and other polymers. The material selected for the PMC can be one which is photosensitive, flowable, and curable (i.e. b-stage capable). The material selected for the base film can be one which is flexible and has a sufficient breaking strength to provide the functionality described below without rupturing.

In one embodiment, the PMC can be between about 25 µm and about 200 µm thick, while the base film can be between about 25 µm and about 100 µm thick. The process can further include exposing first areas 32 of the PMC 24 to radiation 28 patterned through a photomask 30, while second areas 34 of the PMC are not exposed to the radiation. It will be appreciated that while the process as described herein includes the use of a positive PMC, a negative PMC may be used instead.

Figure 3:
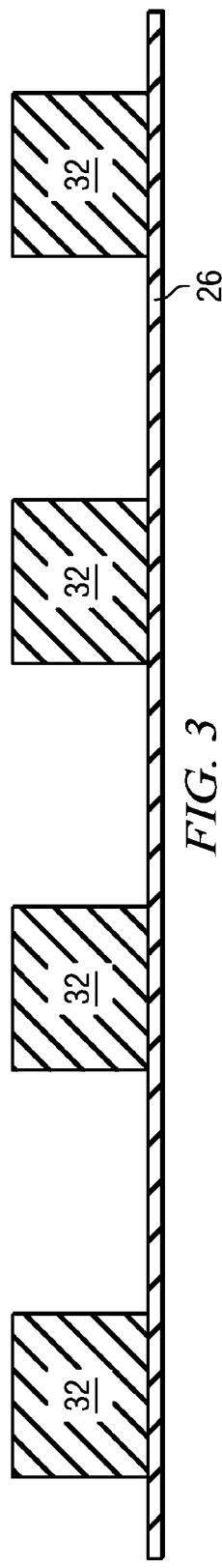

After exposing the PMC, the unexposed material (if positive PMC is used) or the exposed material (if negative PMC is used) is removed to result in a plurality of individual mold compound structures 32 as depicted in FIG. 3. The thickness of each remaining mold compound structure 32, as well as the width and length of the exposed areas, are controlled to provide structures of a specified volume. The volume of remaining material is customized for the volume it is to fill in subsequent processing steps.

Figure 4:
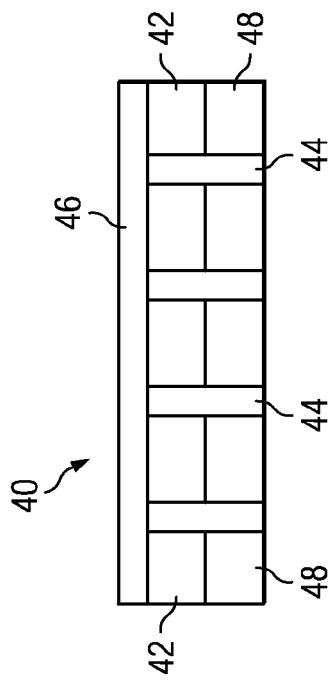
FIG. 4 is a cross section of a die having through-substrate vias.

Next, one or more semiconductor devices 40 such as the one depicted in FIG. 4 are provided by forming the devices according to known techniques or obtaining the devices from a supplier. In this embodiment, each device 40 includes a silicon wafer section 42 having one or more TSV's 44 and interconnect metallization 46 on the front surface (circuit side) of the die 42. Optionally, the device can also include a nonconductive film (NCF) 48, such as an underfill TSV interconnection.

Figure 5:
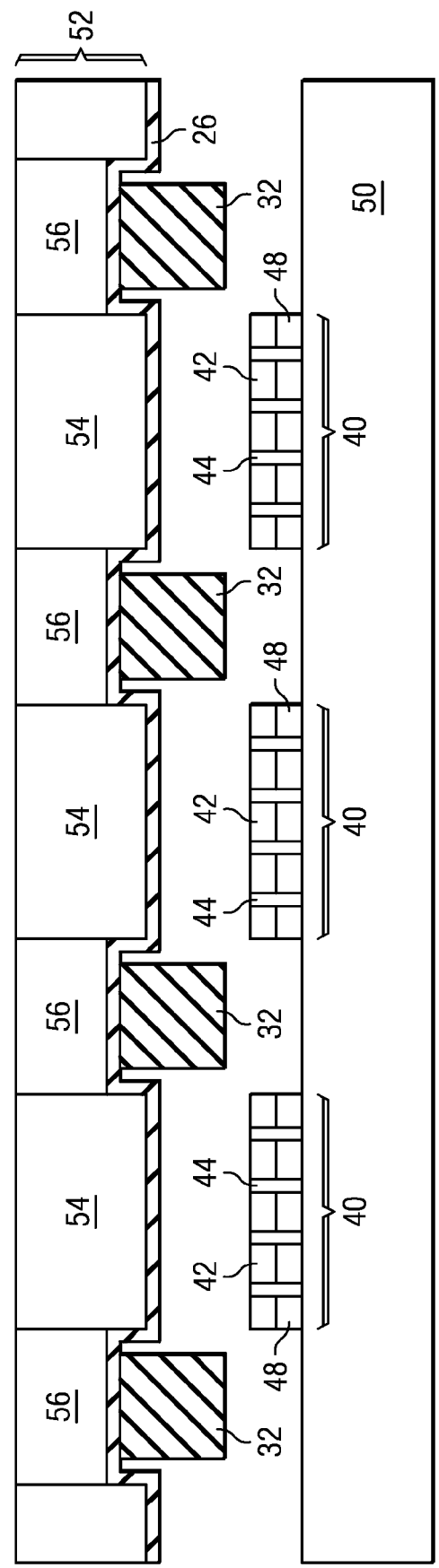

The one or more semiconductor devices 40 are attached to a receiving substrate 50 such as a semiconductor wafer, PCB, etc. as depicted in FIG. 5. The base film 26 and attached PMC 32 are placed onto a press die 52, which can include two or more first sections 54 and at least one second section 56. Each PMC structure 32 is located within a recess in a surface of the press die as depicted. The press die 52 is positioned over the assembly including the die 40 and receiving substrate 50, and the press die is urged toward the die-receiving substrate assembly until contact between the base film 26 and each semiconductor die 40 is made.

Figure 6:
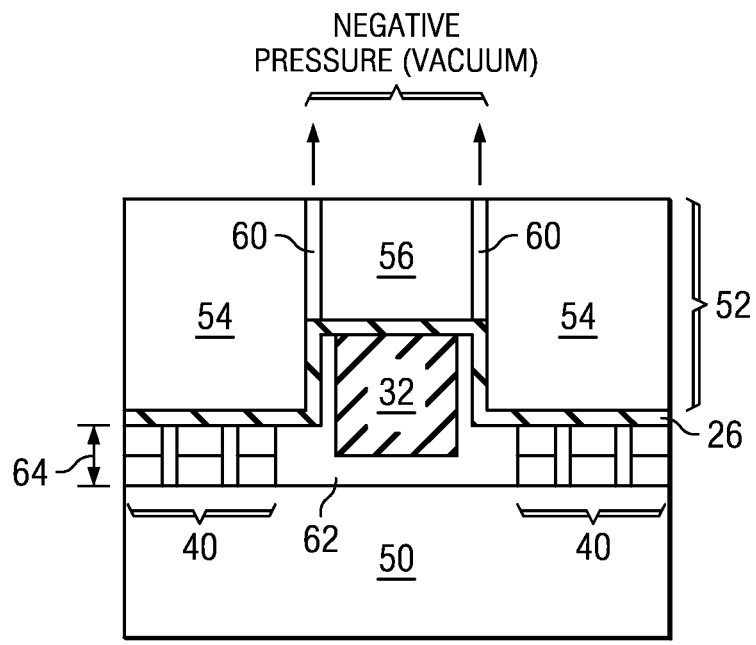

FIG. 6 depicts a magnified view of a portion of FIG. 5. The press die 52 includes at least one opening therein (or two or more, as depicted) forming at least one channel 60 through the press die 52. To hold the base film 26 in contact with the press die 52, the first sections 54 are placed in contact with the base film 26 and a negative pressure (i.e. a vacuum) is applied to the at least one channel 60 to deform the base film 26 and to hold the base film in contact with the press die 52. The vacuum can be applied using an air pump and air-filled channels, although other embodiments are contemplated which use a fluid pump and fluid-filled channels. After placing the press die over the receiving substrate, the press die is urged toward the receiving substrate 50 with sufficient force that the base film 26 provides a seal on the top of the semiconductor dice 40, but not excessive force that would damage the exposed circuitry. An enclosed air gap 62 or space is formed by the base film 26 and the semiconductor dice 40, which is to be filled with the PMC 32. The enclosed air gap to be filled can include the space between adjacent dice 40 which extends from the upper surface of the receiving substrate 50 to a height equal to a thickness of the dice (depicted as "64"). In another embodiment, the enclosed air gap to be filled will be at a height less than the thickness of the dice to ensure that mold flash does not form.

Figure 7:
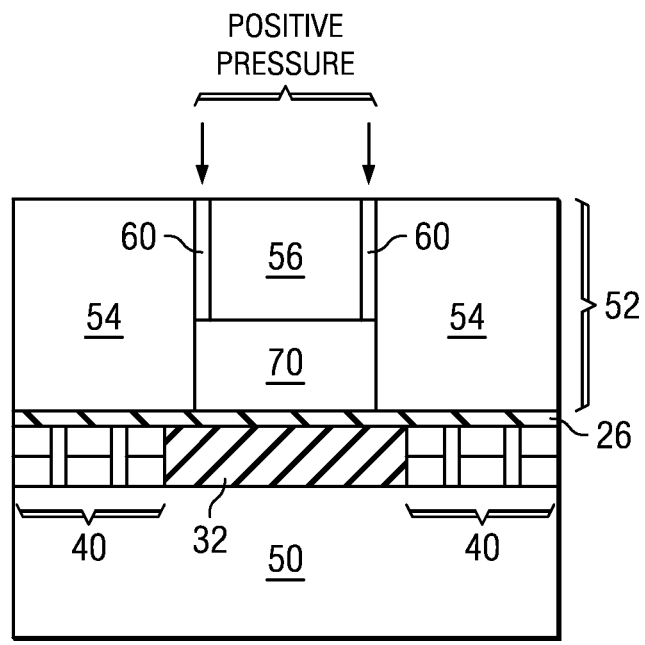

Subsequently, the PMC is flowed, for example through the application of heat, for example by heat supplied though a heated press die, and a positive pressure is applied to the at least one channel 60 as depicted in FIG. 7. The positive pressure forces the base film 26 away from the second portions 56 of the press die 52, such that an air gap forms between the second press die portion 56 and the base film 26. The application of positive pressure also forces the flowed PMC into the lower portion of the air gap 62 of FIG. 6. The pressure applied between the first portions 54 of the press die 52 and the semiconductor dice 40 is greater than the positive pressure applied to the base film 26 through the one or more channel 60. This ensures that PMC is not forced between the semiconductor dice 40 and the base film 26, which would otherwise result in mold flash. Through a combination of controlled pressure applied between the first sections 54 of the press die 52 and the semiconductor dice 40, a controlled positive pressure applied through the one or more channels 60, and a measured volume of PMC 32 which is matched to the volume to be filled, the space between adjacent dice 40 can be filled by the PMC 32 while avoiding mold flash over the front surface of the semiconductor dice 40.

In an embodiment, the volume of the PMC 32 is equal to the volume to be filled between adjacent semiconductor dice. In another embodiment, the volume of the PMC 32 is less than the volume to be filled to ensure that mold flash is avoided.

Subsequent to flowing the PMC 32, it is cured, a negative pressure is again applied to the at least one channel 60 to hold the base film 26 in place, and the press die 52 is urged away from the semiconductor dice 40 and substrate 50 to result in the structure of FIG. 8.

Optionally, particularly when using a receiving substrate 50 which includes a semiconductor wafer, the process can continue with physical attachment of the FIG. 8 assembly to a carrier wafer 90 or other structure as depicted in FIG. 9. Attachment can be made using a temporary carrier bonder adhesive 92. The receiving substrate 50 can be back ground to result in a thinned receiving substrate 50 as depicted in FIG. 10, and an overall thinner device.

After thinning the receiving substrate 50, the die-receiving substrate assembly can be attached to dicing tape 110 as depicted in FIG. 11. A conductor such as solder bumps, solder balls, etc. 112 can be attached to the TSV's and/or front side circuitry of the plurality of dice, then the structure can be singulated, for example along scribe lines 114, to result in a plurality of individual semiconductor devices 120 as depicted in FIG. 12. The individual semiconductor devices can be attached to a PCB, to another wafer, stacked with similar devices, etc.

Various modifications to the embodiments described above are contemplated. For example, the semiconductor dice 40 of FIG. 6 can be formed closer together to provide completed devices with a smaller footprint.

In another embodiment, the PMC is formed thicker and narrower than that depicted in FIG. 6. The PMC 32 contacts the receiving substrate 50 prior to contact between the base film 26 and the semiconductor dice 40. As the PMC is flowed, opposing pressure between the press die 52 and the receiving substrate 50 result in subsequent contact between the base film 26 and the semiconductor dice 40, with a pressure which is sufficient to seal the air gap 62 to prevent mold flash. Opposing pressure between the base film 26 and the semiconductor dice is greater than the pressure to the PMC imparted by the positive pressure exerted through the at least one channel 60 to the base film 26.

In another embodiment, the first sections 54 and the second section(s) 56 of the press die 52 are moveable with respect to each other, for example by forming the second section(s) to be narrower than the distance between adjacent first sections. Thus the second section(s) 56 can function as a piston within the first sections 54. Negative pressure to the base film can result from upward movement of the second section(s) away from the base film, while positive pressure to the base film can result from downward movement toward the base film. The second sections can be between about 0.1 millimeter (mm) and about 0.2 mm narrower than the distance between the first sections. Further, while the first sections 54 are depicted as being separate, the first section may be one single block with openings therein to receive the second sections such that movement of the second sections within the first sections can occur.

The width of the first sections 54 can be equal to, or greater than, the width of the semiconductor dice to exert pressure to the entire upper surface of each semiconductor die to prevent mold flash on any of the circuit side. In another embodiment, the upper surface of each first section is smaller than the upper surface of each semiconductor die so that a portion of the upper surface is encapsulated in mold compound. Each first section, however, should be sufficiently large so that mold compound does not cover the area where electrical contact is to be made.

In another embodiment, the press die can be a solid rectangular block with a flat lower surface. A porous mesh material such as stainless steel, aluminum, titanium, and other possible metals is formed along the lower surface of the block. The mesh material can be contoured with an indentation where the PMC will be formed. Air pumped into the porous mesh can provide a positive pressure to the base film and thus to the mold compound, while air pumped out of the porous mesh can provide a negative pressure.

Figure 13:
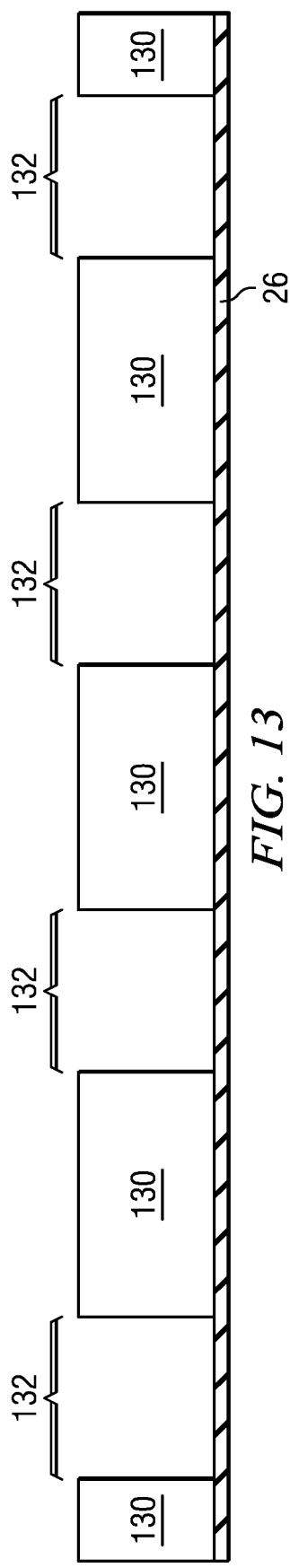
FIGS. 13-15 are cross sections depicting another method to form in-process mold compound structures having a controlled volume according to the present teachings to form a semiconductor device.
Figure 14:
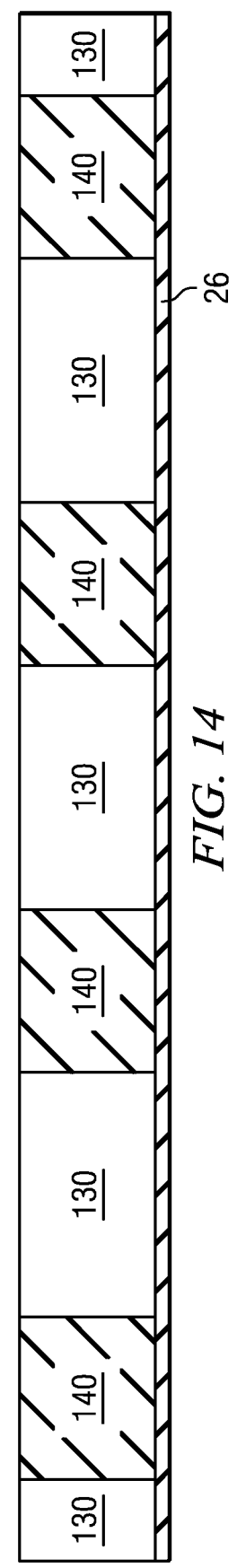
Figure 15:
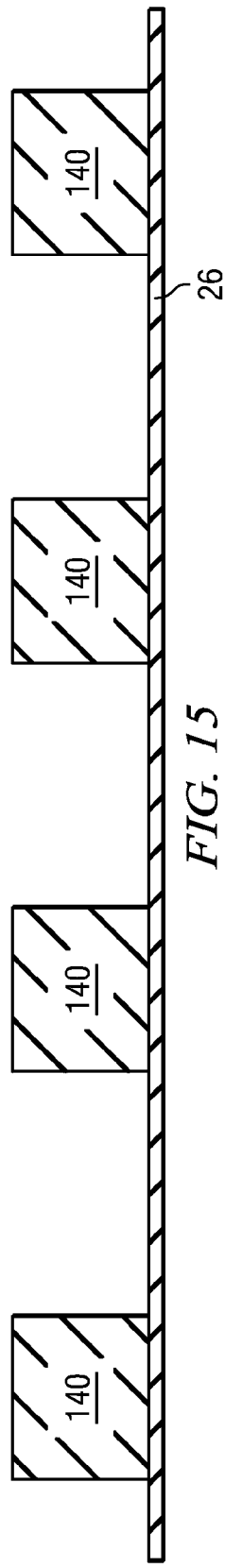

Another embodiment is depicted in FIGS. 13-15. In this embodiment, a mold compound such as a thermoplastic mold compound is placed onto a base film using a screen printing technique. In FIG. 13, a patterned mask 130 having voids 132 therein is placed onto a base film 26. A thermoplastic mold compound is flowed and moved across an upper surface of the screen 130 under pressure such that it fills the voids 132 in the patterned mask to result in individual mold compound structures 140 as depicted in FIG. 14. The mold compound 140 is hardened (cured) and the patterned mask is removed to result in the FIG. 15 structure. Processing can then continue, for example according to the techniques described above.

Figure 16:
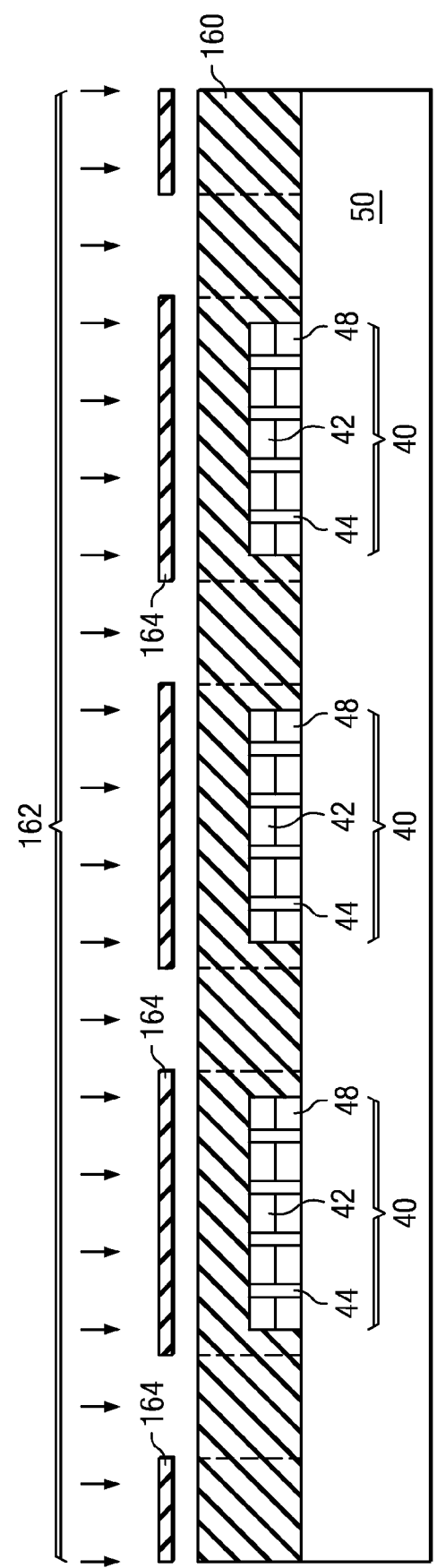
FIGS. 16-18 are cross sections depicting another method to form in-process mold compound structures having a controlled volume according to the present teachings to form a semiconductor device.
Figure 17:
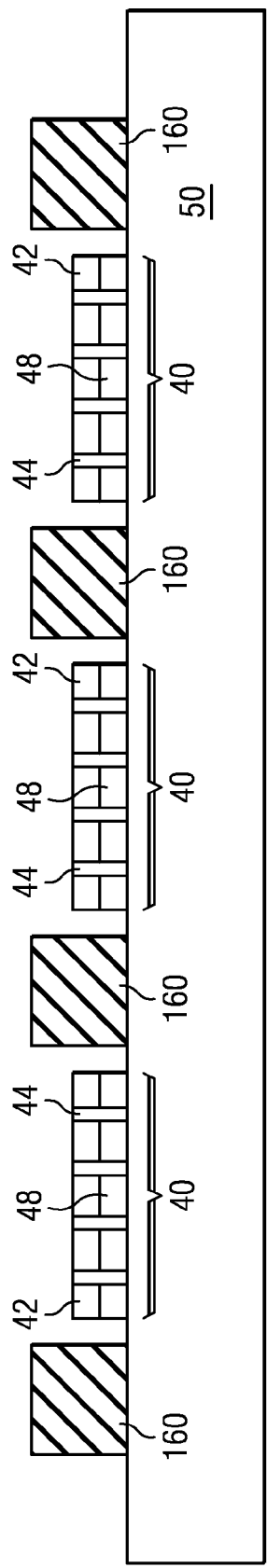
Figure 18:
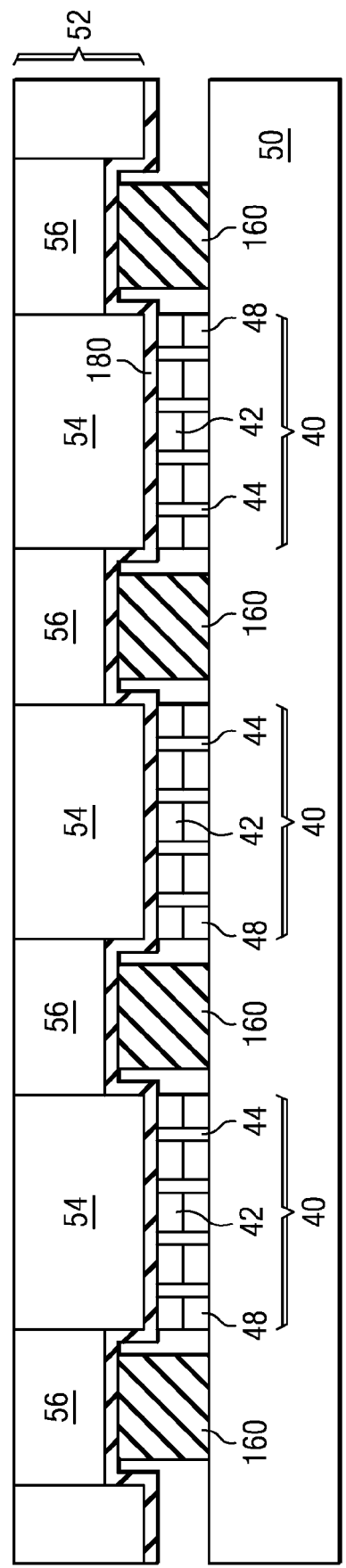

Another embodiment of the present teachings can start with an assembly comprising at least two semiconductor dice 40 connected to a supporting substrate 50 such as that depicted in FIG. 16. Semiconductor dice 40 and supporting substrate 50 can be in accordance with previous embodiments. Next, a layer of liquid PMC 160 can be applied to the assembly as depicted in FIG. 17. Application of the PMC 160 can be performed using a method such as spin coating, screen printing, spraying, etc. The PMC 160 is exposed to patterned radiation 162 through a patterned mask 164 such that the PMC overlying the semiconductor dice can be removed selective to the material interposed between the semiconductor dice. Either a positive PMC or a negative PMC can be used. The PMC overlying the semiconductor dice is removed, which can result in a structure similar to that depicted in FIG. 17. Next, a press die, which can be a press die 52 in accordance with previous embodiments, urges a layer of flexible material 180 toward the PMC 160 and the semiconductor dice 40 as depicted in FIG. 18. The layer of flexible material 180, which can be a material similar to the base film of previous embodiment, can be attached to a surface of the press die using negative pressure applied through a channel in the press die in accordance with previous embodiments. The front exposed surfaces of the semiconductor dice 40 and the PMC 160 are contacted with the flexible material 180 as depicted in FIG. 18.

Next, pressure is applied to the PMC 160, for example by applying a positive pressure through the channel in the press die. Pressure exerted by the press die to the semiconductor dice 40 through contact with the flexible material 180 can be greater than the pressure applied to the PMC 160 through the flexible layer 180. Processing can then continue according to previous embodiments, for example to form structures similar to those depicted in FIGS. 8-12 and described in the accompanying text.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method for forming a semiconductor device, comprising:
   providing a patterned layer of mold compound having a plurality of individual mold compound structures overlying a base film, comprising:
   exposing a layer of photosensitive mold compound overlying the base film to patterned radiation;
   removing a first portion of the exposed layer of photosensitive mold compound from the base film and leaving a patterned second portion of the layer of exposed photosensitive mold compound overlying the base film to provide the individual mold compound structures;
   aligning the plurality of individual mold compound structures with a plurality of semiconductor dice to interpose the individual mold compound structures between the plurality of semiconductor dice; and applying pressure to the individual mold compound structures to fill spaces between each of the plurality of semiconductor dice with the mold compound.

2. A method for forming a semiconductor device, comprising:

providing a patterned layer of mold compound having a plurality of individual mold compound structures overlying a base film, comprising:

placing a patterned mask onto the base film;

screen printing a mold compound across the patterned mask to fill voids in the patterned mask;

curing the mold compound;

removing the patterned mask from the base film to provide the plurality of individual mold compound structures overlying the base film;

aligning the plurality of individual mold compound structures with a plurality of semiconductor dice to interpose the individual mold compound structures between the plurality of semiconductor dice; and applying pressure to the individual mold compound structures to fill spaces between each of the plurality of semiconductor dice with the mold compound.

3. A method for forming a semiconductor device, comprising:

providing a patterned layer of mold compound having a plurality of individual mold compound structures overlying a base film;

aligning the plurality of individual mold compound structures with a plurality of semiconductor dice to interpose the individual mold compound structures between the plurality of semiconductor dice;

applying pressure to the individual mold compound structures to fill spaces between each of the plurality of semiconductor dice with the mold compound;

providing the plurality of semiconductor dice, wherein each semiconductor die comprises at least one through-substrate via (TSV) which extends from a front of the semiconductor die to a back of the semiconductor die;

during the application of pressure to the individual mold compound structures, contacting a surface of each TSV with the base film; and subsequent to applying pressure to the patterned second portion of the layer of exposed photosensitive mold compound, curing the patterned second portion of the layer of exposed photosensitive mold compound wherein, subsequent to the curing, the surface of each TSV remains exposed through the cured mold compound.

4. The method of claim 3, further comprising, during the application of pressure to the individual mold compound structures, applying a first pressure to the individual mold compound structures and a second pressure between the surface of each TSV and the base film, wherein the second pressure is greater than the first pressure.

5. A method for forming a semiconductor device, comprising:

providing a patterned layer of mold compound having a plurality of individual mold compound structures overlying a base film;

aligning the plurality of individual mold compound structures with a plurality of semiconductor dice to interpose the individual mold compound structures between the plurality of semiconductor dice;

applying pressure to the individual mold compound structures to fill spaces between each of the plurality of semiconductor dice with the mold compound;

attaching a back side of each of the plurality of semiconductor dice to a supporting substrate;

during the application of pressure to the individual mold compound structures, contacting the supporting substrate with the mold compound;

curing the mold compound structures which fill the spaces between each of the plurality of semiconductor dice and which contacts the supporting substrate;

attaching a front side of each of the plurality of semiconductor dice to a carrier wafer;

after curing the mold compound structures, back grinding the supporting substrate to thin the supporting substrate;

removing the plurality of semiconductor dice from the carrier wafer; and singulating the plurality of semiconductor dice by severing the cured mold compound and the supporting substrate.

6. A method for forming a semiconductor device, comprising:

providing a patterned layer of mold compound having a plurality of individual mold compound structures overlying a base film;

aligning the plurality of individual mold compound structures with a plurality of semiconductor dice to interpose the individual mold compound structures between the plurality of semiconductor dice;

applying pressure to the individual mold compound structures to fill spaces between each of the plurality of semiconductor dice with the mold compound comprising:

holding the base film in contact with a press die by applying a negative pressure to at least one channel through the press die;

while holding the base film in contact with the press die, contacting the plurality of semiconductor dice with the base film; and with the base film in contact with the plurality of semiconductor dice, applying a positive pressure to the at least one channel through the press die to deform the base film and to apply the pressure to the individual mold compound structures.

7. A method for forming a semiconductor device, comprising:

applying a layer of photosensitive mold compound to an assembly comprising at least two semiconductor dice connected to a supporting substrate;

exposing the layer of photosensitive mold compound to patterned radiation;

removing a first portion of the exposed layer of photosensitive mold compound from over the at least two semiconductor dice and leaving a patterned second portion of the layer of exposed photosensitive mold compound over the supporting substrate and interposed between the at least two semiconductor dice;

contacting a front surface of each semiconductor die with a flexible material;

while contacting the upper surface of each semiconductor die with the flexible material, applying pressure to the layer of photosensitive mold compound; and curing the layer of photosensitive mold compound.

8. The method of claim 7 wherein the application of the layer of photosensitive mold compound to the assembly comprises a method selected from the group consisting of spin coating, screen printing, and spraying the layer of photosensitive mold compound.

9. The method of claim 8 wherein the application of the layer of photosensitive mold compound comprises applying a layer of liquid negative photosensitive mold compound.

10. The method of claim 7 further comprising:
the contacting of the upper surface of each semiconductor die with the flexible material comprises applying a first pressure to the upper surface of each semiconductor die with the flexible material; and
the application of pressure to the layer of photosensitive mold compound comprises applying a second pressure to the layer of photosensitive mold compound,
wherein the first pressure is greater than the second pressure.

11. A press die used to form a semiconductor device, the press die comprising:
a surface for receiving a base film;
a press for urging the surface toward a plurality of semiconductor dice and for holding the base film in contact under pressure with the plurality of semiconductor dice;
a structure adapted to deform the base film with the base film in contact with the plurality of semiconductor dice, wherein the structure adapted to deform the base film comprises:
at least one channel through the press die, wherein the channel comprises an opening at the surface; and
a pump for applying a negative pressure to the at least one channel and for applying a positive pressure to the at least one channel.

12. A press die used to form a semiconductor device, the press die comprising:
a surface for receiving a base film;
a press for urging the surface toward a plurality of semiconductor dice and for holding the base film in contact under pressure with the plurality of semiconductor dice; and
a structure adapted to deform the base film with the base film in contact with the plurality of semiconductor dice, wherein the structure adapted to deform the base film comprises:
at least two first sections having an opening therein, wherein the opening has a first width; and
at least one second section received by the opening in the at least two first sections, wherein a width of the at least one second section is less than the width of the opening in the at least two first sections such that the at least one second section is movable relative to the at least two first sections.

* * * * *